United States Patent
Mabuchi

(10) Patent No.: US 7,339,151 B2
(45) Date of Patent: Mar. 4, 2008

(54) IMAGE PICKUP DEVICE WITH TIME DIVISION OUTPUT OF PIXEL SIGNAL AND INVERTED PIXEL SIGNAL

(75) Inventor: Keiji Mabuchi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/600,846

(22) Filed: Nov. 17, 2006

(65) Prior Publication Data

US 2007/0057155 A1 Mar. 15, 2007

Related U.S. Application Data

(63) Continuation of application No. 10/355,065, filed on Jan. 31, 2003, now Pat. No. 7,138,617.

(30) Foreign Application Priority Data

Dec. 2, 2002 (JP) ............................ P2002-033883

(51) Int. Cl.
*H04N 5/00* (2006.01)
*H04N 5/21* (2006.01)
*H01L 27/00* (2006.01)
(52) U.S. Cl. .............................. 250/208.1; 250/214 A; 250/214.1; 250/214 R; 348/222.1; 348/241; 348/294; 348/300
(58) Field of Classification Search ............. 250/208.1, 250/214.1, 214 R, 214 A, 214 DC; 348/222.1, 348/294, 308, 310, 579, 241, 250, 300
See application file for complete search history.

(56) References Cited

U.S. PATENT DOCUMENTS

| 6,072,366 | A | 6/2000 | Maeda et al. | |
| 6,353,488 | B1 | 3/2002 | Hieda et al. | |
| 6,822,211 | B2 | 11/2004 | Hagihara | |
| 6,881,942 | B2 | 4/2005 | Huang et al. | |
| 6,977,684 | B1 * | 12/2005 | Hashimoto et al. | 348/294 |
| 7,088,769 | B2 * | 8/2006 | Ookubo et al. | 375/225 |

* cited by examiner

*Primary Examiner*—Davienne Monbleau
(74) *Attorney, Agent, or Firm*—Rader Fishman & Grauer PLLC; Ronald P. Kananen

(57) ABSTRACT

A solid-state image pickup device has a differential output configuration for an output stage thereof and an IC in a next stage has a differential amplifier configuration for an input stage thereof. An output buffer unit buffers and outputs a digital signal from a horizontal bus line. At this time, in addition to the normal video signal, the output buffer unit generates an inverted output of the normal video signal. The normal video signal and the inverted output are outputted from a video signal output terminal and an inverted video signal output terminal, respectively, to the outside of a chip. Further, a clock, which is supplied from a timing generator to the output buffer unit, also is buffered and outputted to the outside together with an inverted clock. A differential amplifier is used in an input stage of an IC in a next stage, whereby even signals having blunter waveforms can be recognized. This enables an increase in the speed of the system, an addition of capacitance to signal paths, or a reduction in size of the output buffer unit of the solid-state image pickup device.

14 Claims, 8 Drawing Sheets

FIG. 3A  OUTPUT CLOCK
FIG. 3B  INVERTED OUTPUT CLOCK
FIG. 3C  ONE VIDEO SIGNAL OUTPUT
FIG. 3D  CORRESPONDING INVERTED VIDEO OUTPUT

FIG. 6A  STROBE
FIG. 6B  INVERTED STROBE
FIG. 6C  VIDEO SIGNAL OUTPUT
FIG. 6D  INVERTED VIDEO SIGNAL OUTPUT

IMAGE PICKUP DEVICE WITH TIME DIVISION OUTPUT OF PIXEL SIGNAL AND INVERTED PIXEL SIGNAL

CROSS REFERENCE TO RELATED APPLICATIONS

This application is a continuation of Application Ser. No. 10/355,065, filed on Jan. 31, 2003, now U.S. Pat. No. 7,138,617 the entire contents of which are hereby incorporated by reference.

BACKGROUND OF THE INVENTION

The present invention relates to a solid-state image pickup device and an output method thereof used in various image sensors and camera systems for taking a picture of a subject and outputting a video signal.

Conventionally, in a case of 10-bit digital output, for example, this type of solid-state image pickup device has ten output terminals corresponding to the bit width.

Specifically, in the solid-state image pickup device, each light signal read from an image pickup pixel unit is sampled into 10 bits, the ten output terminals become high or low in synchronism with a clock, and thereby a signal of one pixel is outputted with one clock.

It has recently been important to increase reading speed. In a VGA format with about three hundred thousand pixels, for example, an output rate is 12 MHz, and 30 images per second, which is seen by the human eye to be a smooth moving image, can be outputted.

However, to output 30 images per second from a solid-state image pickup device with three million pixels or 30 million pixels requires high-speed operation at 120 MHz or 1.2 GHz.

Further, even if such an extremely large number of pixels is not required, to construct a camera system required to have a high time resolution for crash tests on cars and the moment of impact of a ball hit by a baseball batter, for example, requires an output of 100 to 1000 images per second and, thus, a high-speed output.

Thus, conventionally, the number of output terminals is increased to provide hundreds of output terminals, whereby video signals are outputted in parallel.

Such a configuration in which output terminals are simply provided in parallel with each other, however, has a large number of output terminals, thus leading to an increase in area and cost of the solid-state image pickup device.

An IC in a next stage also is increased in size with an increased number of input terminals. As a result, various problems occur, such as difficulty in implementation, difficulty in reducing the size of the camera, difficulty in synchronizing many output signals, difficulty in output at high clock speeds because of the problem of synchronization, and the like.

On the other hand, to reduce the number of output terminals requires an increase in the clock speed. When the clock speed is increased, however, the time of charging and discharging a capacitance of a path to the IC in the next stage cannot be ignored, and waveforms are blunted. In the worst case, signals do not reach a high/low level of the IC in the next stage, and consequently the IC in the next stage cannot recognize the signals.

Such a problem occurs not only when the clock speed is to be increased but also when the capacitance in a signal path is increased for some reason, for example, because the path to the IC in the next stage is desired to be lengthened for use in an endoscope.

Further, output at a high clock speed causes undesired radiation to be emitted from the signal path between the solid-state image pickup device and the IC in the next stage and, thus, affects operation of other electronic apparatuses and the solid-state image pickup device itself. Audio/video apparatuses, for example, cause degradation in sound quality/picture quality.

SUMMARY OF THE INVENTION

Accordingly, it is an object of the present invention to provide a solid-state image pickup device and an output method thereof that can realize the super-high speed of video signals and reduce undesired radiation.

In order to achieve the above object, according to an aspect of the present invention, there is provided a solid-state image pickup device comprising: an image pickup pixel unit including a plurality of pixels; a signal processing unit for subjecting a video signal outputted from the image pickup pixel unit to predetermined signal processing; and an output buffer unit for outputting the video signal processed by the signal processing unit, wherein the output buffer unit outputs the video signal and an inverted video signal obtained by inverting the video signal.

Further, according to another aspect of the present invention, there is provided an output method of a solid-state image pickup device, the solid-state image pickup device including: an image pickup pixel unit including a plurality of pixels; a signal processing unit for subjecting a video signal outputted from the image pickup pixel unit to predetermined signal processing; and an output buffer unit for outputting the video signal processed by the signal processing unit, and the output method comprises: outputting the video signal and an inverted video signal obtained by inverting the video signal from the output buffer unit.

The solid-state image pickup device according to the present invention outputs the video signal and the inverted video signal of the video signal from the output buffer unit. Therefore, by using a differential circuit in an input stage of a circuit in a next stage, it is possible to realize a configuration that enables even signals blunted to some degree to be detected reliably, and thereby to realize the super-high speed of video signals.

Further, the output method according to the present invention outputs the video signal and the inverted video signal of the video signal from the output buffer unit. Therefore, by using a differential circuit in an input stage of a circuit in a next stage, it is possible to realize a configuration that enables even signals blunted to some degree to be detected reliably, and thereby to realize the super-high speed of video signals.

DETAILED DESCRIPTION OF THE PREFERRED EMBODIMENTS

Preferred embodiments of a solid-state image pickup device and an output method thereof according to the present invention will hereinafter be described.

The output methods of the solid-state image pickup devices according to the embodiments use a differential output configuration and an IC in a next stage that uses a differential-amplifier configuration for input, whereby a super-high speed of a video signal is realized while controlling an increase in clock speed. It is thereby possible to alleviate the problem of undesired radiation and to reduce the number of output terminals by serial output. Further, as later described, it is more desirable to use a strobe signal output.

Concrete examples of the present invention will be described hereinafter.

Figure 1:
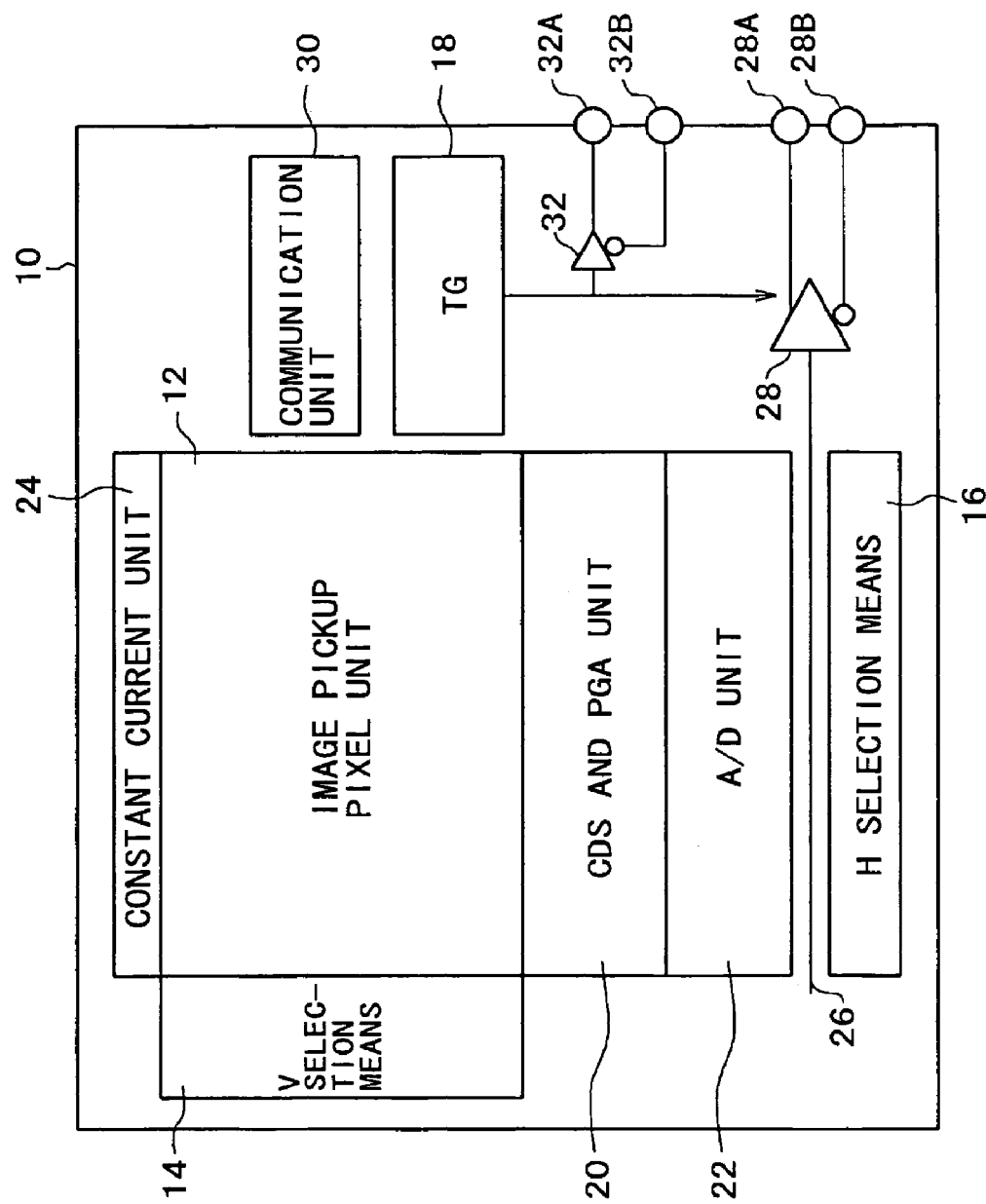
FIG. 1 is a plan view of an outline of a solid-state image pickup device according to a first embodiment of the present invention.

FIG. 1 is a plan view of an outline of a solid-state image pickup device according to a first embodiment of the present invention, showing the main components necessary for a description of the solid-state image pickup device as a whole according to the first embodiment.

The solid-state image pickup device according to the first embodiment is specifically a CMOS-type image sensor. The solid-state image pickup device according to the first embodiment includes an image pickup pixel unit 12, V-selection means 14, H-selection means 16, a timing generator (TG) 18, a CDS and PGA unit 20, an A/D unit 22, a constant current unit 24, a horizontal bus line 26, an output buffer unit 28, a communication unit 30 and the like, which are formed on a semiconductor chip 10.

Figure 2:
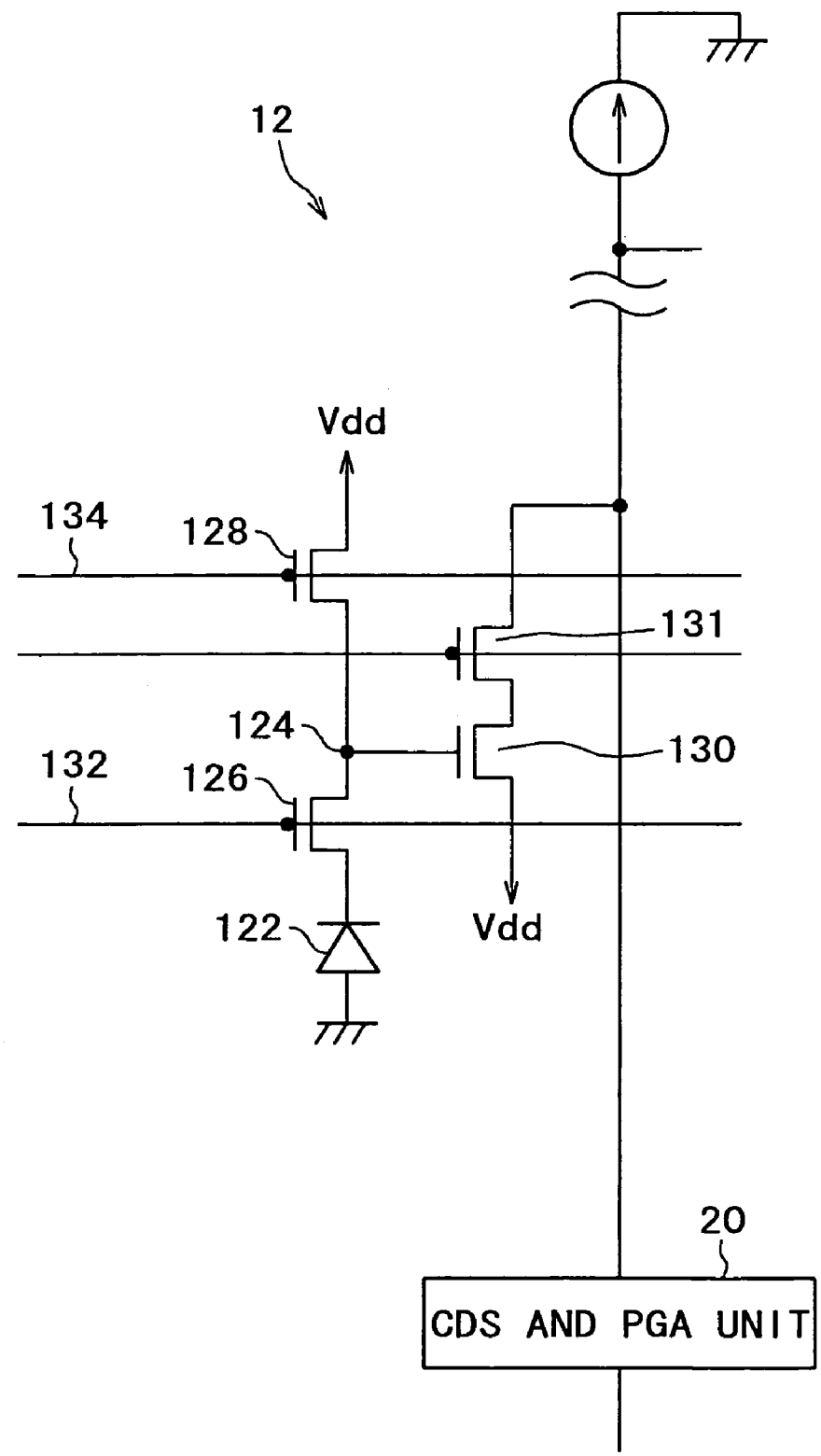
FIG. 2 is a circuit diagram of an outline of a unit pixel of the solid-state image pickup device shown in FIG. 1.

The image pickup pixel unit 12 has a large number of pixels arranged in the form of a two-dimensional matrix. As shown in FIG. 2, each of the pixels includes a photodiode 122, serving as a photoelectric converting device for generating a signal charge corresponding to an amount of light received and storing the signal charge, and MOS transistors, such as a transfer transistor 126, for transferring the signal charge converted and stored by the photodiode 122 to a floating diffusion part (FD part) 124, a reset transistor 128 for resetting a potential of the FD part 124, an amplifying transistor 130 for outputting an output signal corresponding to the potential of the FD part 124, and an address transistor 131 for selecting a pixel.

Further, the image pickup pixel unit 12 has various driving wirings 132 and 134 arranged in a horizontal direction for driving and controlling the MOS transistors. The pixels of the image pickup pixel unit 12 are sequentially selected in units of a horizontal line (pixel row) in a vertical direction by the V-selection means 14. The MOS transistors of each of the pixels are controlled by various pulse signals from the timing generator 18. Thereby, a signal of each of the pixels is outputted to the CDS and PGA unit 20 via a vertical signal line for each pixel column.

The CDS and PGA unit 20 has a CDS and PGA circuit for each pixel column of the image pickup pixel unit 12. The CDS and PGA unit 20 subjects a pixel signal read from each pixel column of the image pickup pixel unit 12 to signal processing, such as CDS (correlated double sampling) and PGA (programmable gain control), and then outputs a resulting pixel signal to the A/D unit 22.

The A/D unit 22 has an A/D conversion circuit for each pixel column of the image pickup pixel unit 12. The A/D unit 22 converts the pixel signal of each pixel column from the CDS and PGA unit 20 from analog signal form to digital signal form and then outputs the result.

The H-selection means 16 selects digital signal outputs from the A/D unit 22 in a horizontal direction and then outputs the digital signal outputs to the horizontal bus line 26. It is to be noted that the first embodiment adopts 10-bit output and has ten horizontal bus lines 26.

The constant current unit 24 supplies the image pickup pixel unit 12 as described above with a constant current for each pixel column.

The timing generator 18 supplies parts other than the pixels of the image pickup pixel unit 12 as described above with various timing signals.

The output buffer unit 28 outputs a digital signal supplied thereto from the horizontal bus line 26 to external terminals of the semiconductor chip 10.

The communication unit 30 communicates with the outside of the semiconductor chip 10. The communication unit 30 performs operations such as, for example, controlling an operating mode of the timing generator 18 and outputting parameters indicating the conditions of the semiconductor chip 10 to the outside.

In the above configuration of the first embodiment, the method of outputting a video signal by the output buffer unit 28 and a clock of the timing generator 18 constitutes main characteristic parts of the first embodiment.

First, the output buffer unit 28 in the first embodiment buffers and outputs a digital signal from the horizontal bus line 26. At this time, in addition to the normal video signal, the output buffer unit 28 generates an inverted output of the normal video signal.

The normal video signal and the inverted output are outputted from a video signal output terminal 28A and an inverted video signal output terminal 28B, respectively, to the outside of the chip 10.

It is to be noted that though omitted in FIG. 1, the inverted video signal is formed by 10 bits so as to correspond to the video signal of 10 bits, and output terminals 28A and 28B total 20 (20 bits).

Next, the timing generator 18 supplies a clock (output clock) to the output buffer unit 28. The clock is buffered by another output buffer unit 32, and the clock and a clock obtained by inverting the clock are outputted to the outside from output terminals 32A and 32B, respectively.

Figure 3:
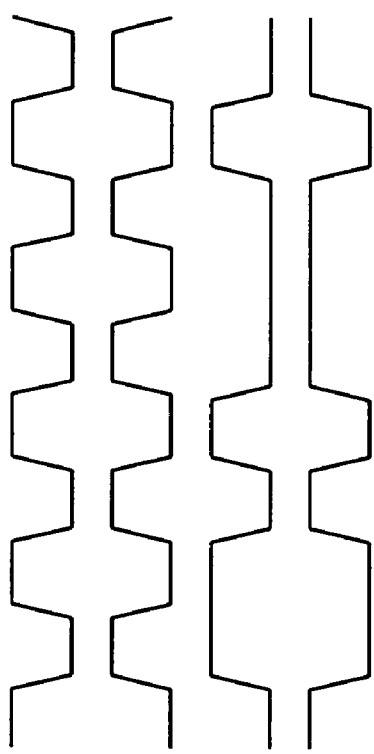
FIGS. 3A, 3B, 3C, and 3D are timing charts showing signal waveforms in an output stage of the solid-state image pickup device shown in FIG. 1.

FIGS. 3A, 3B, 3C, and 3D are timing charts showing signal waveforms in the first embodiment. FIG. 3A shows the output clock; FIG. 3B shows the inverted output clock; FIG. 3C shows one video signal; and FIG. 3D shows an inverted video signal corresponding to the video signal shown in FIG. 3C.

In this case, the signals are changed at both a rising edge and a falling edge of the output clock, and 10 bits per pixel are outputted in half a clock cycle of the output clock.

Figure 4:
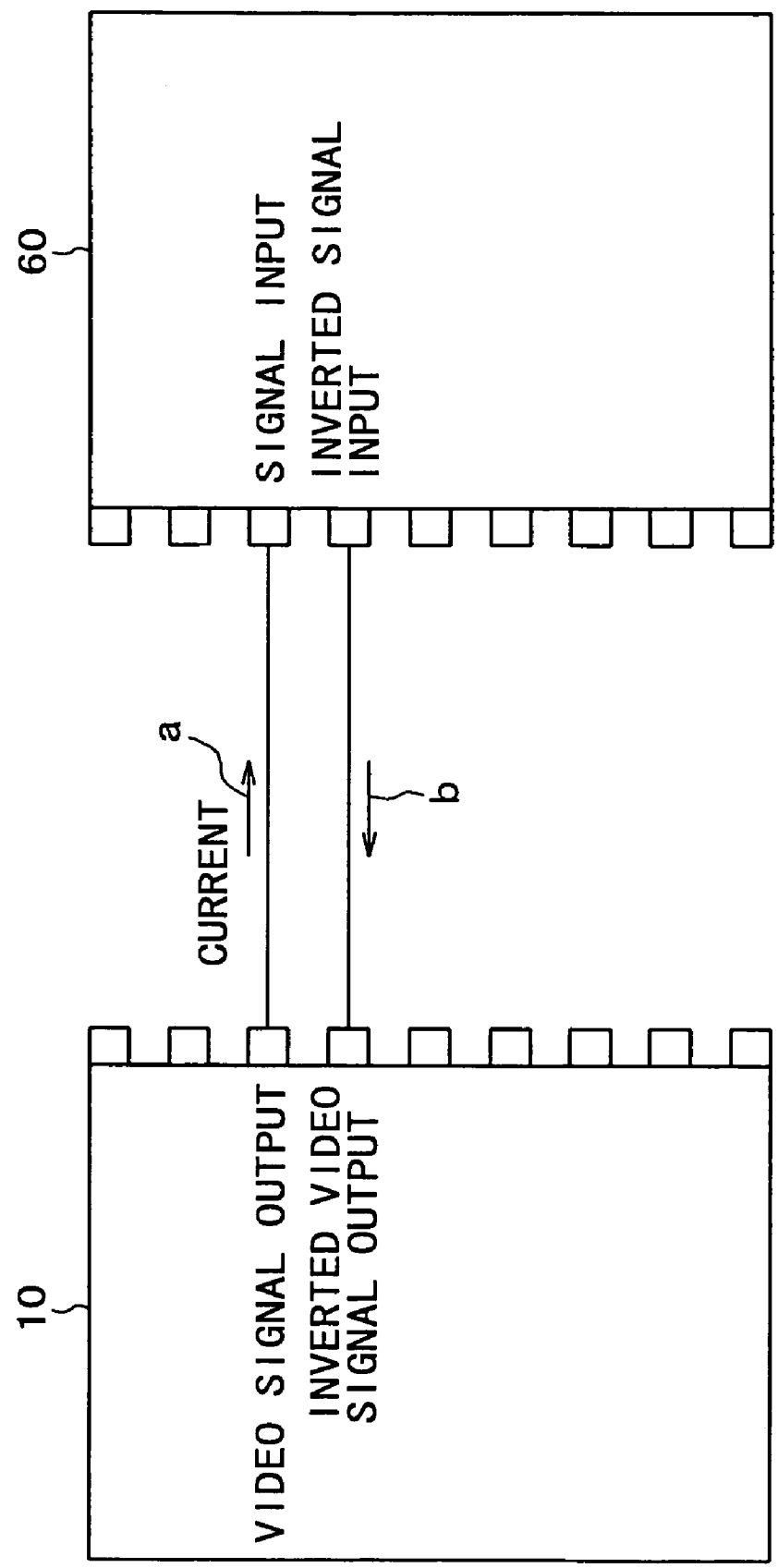
FIG. 4 is a block diagram showing an example of a connection between the solid-state image pickup device shown in FIG. 1 and an IC in a next stage.

FIG. 4 is a block diagram showing an example of a connection between the solid-state image pickup device (semiconductor chip 10) and an IC 60 in a next stage.

The IC 60 in the next stage includes a signal processing circuit, a DSP (Digital Signal Processor) and the like for receiving the video signal and the inverted video signal and performing various kinds of signal processing. The IC 60 in the next stage has a differential amplifier in an input stage thereof, and it is therefore able to recognize even the input signals having waveforms blunted beyond a conventionally-allowable range. This enables a super-high speed of the system, an addition of capacitance to a signal path, or a reduction in the size of the output buffer of the solid-state image pickup device.

When the output signals are changed to a high and a low, charging and discharging current paths flow in the directions of arrows a and b shown in FIG. 4, for example. However, the output and the inverted output cause currents to flow in opposite directions. Therefore, when the paths are disposed adjacent to each other, undesired radiations can be reduced by canceling each other. The above description of the video signals also applies to the output clocks.

It is to be noted that while the example shown in FIG. 1 is a CMOS-type image sensor as an example of a configuration of the solid-state image pickup device, the present invention is not limited to the above-described configuration, and it is similarly applicable to solid-state image pickup devices in general that output digital video signals.

A second embodiment of the present invention will be described next.

While the first embodiment described above has a total of 20 parallel terminals as video signal and inverted video signal output terminals, the second embodiment of the present invention has one video signal output terminal and one inverted video signal output terminal for output by time division. It is to be noted that as in the first embodiment described above, the second embodiment has ten horizontal bus lines.

Figure 5:
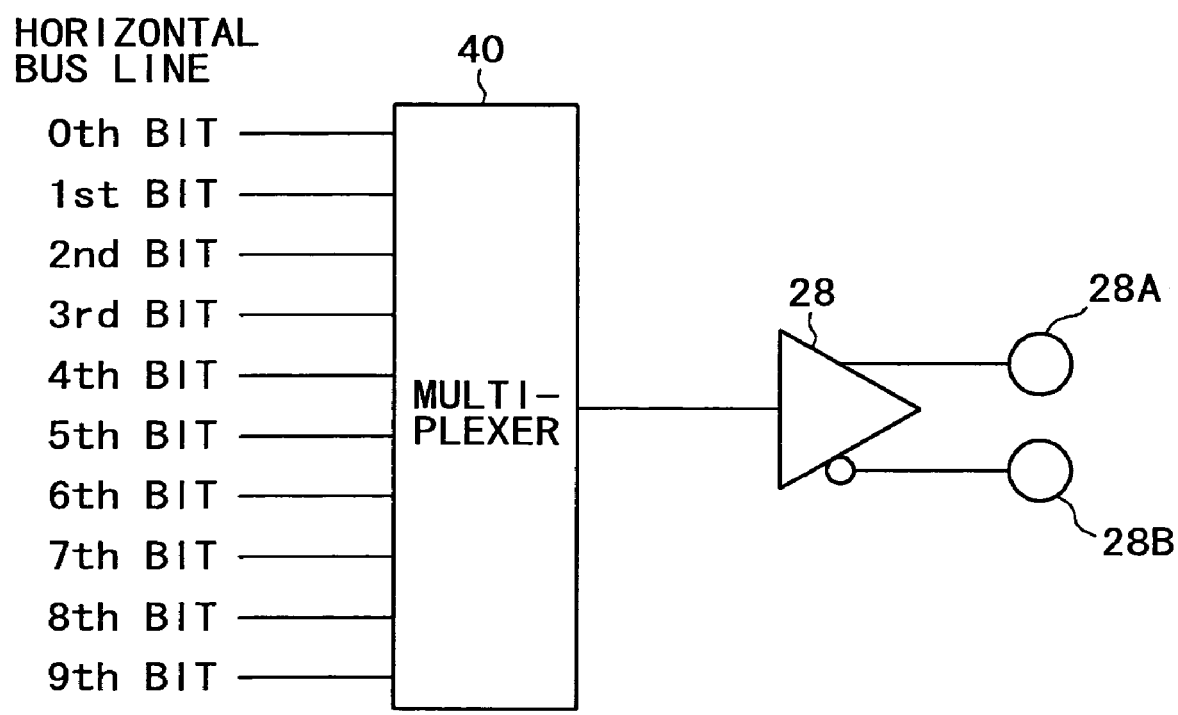
FIG. 5 is a block diagram showing a configuration of an output buffer unit in a solid-state image pickup device according to a second embodiment of the present invention.

FIG. 5 is a block diagram showing a configuration of an output buffer unit in the second embodiment.

As shown in FIG. 5, in the second embodiment, a multiplexer 40 is provided between the horizontal bus lines 26 and the output buffer unit 28.

The multiplexer 40 selects the horizontal bus lines 26 in appropriate timing. A signal of a selected horizontal bus line 26 is inputted to the output buffer unit 28, buffered by the output buffer unit 28, and then led to the video signal output terminal 28A and the inverted-signal output terminal 28B.

Thus, by outputting a 10-bit video signal to the outside of the chip with ten or more clocks, it is possible to reduce the number of output terminals as compared with the foregoing first embodiment. The reduction in the number of output terminals, therefore, makes it possible to miniaturize the solid-state image pickup device and a camera or the like using the solid-state image pickup device. Further, since the second embodiment has a total of two output terminals, it is easy to control a phase difference between output signals to within an allowable range, and it is thus easier to increase clock speed.

With such a configuration, it is desirable to output a strobe signal instead of the clock signal described above.

The strobe signal is inverted in timing in which the video signal is not inverted.

Figure 6:
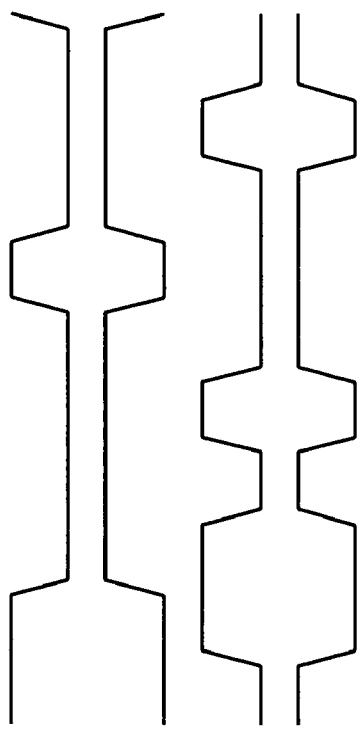
FIGS. 6A, 6B, 6C, and 6D are timing charts showing signal waveforms in an output stage of the solid-state image pickup device shown in FIG. 5.

FIGS. 6A, 6B, 6C, and 6D are timing charts showing signal waveforms in the second embodiment. FIG. 6A shows a strobe signal; FIG. 6B shows an inverted strobe signal; FIG. 6C shows one video signal; and FIG. 6D shows an inverted video signal corresponding to the video signal shown in FIG. 6C.

In this case, since either one of the video signal or the strobe signal is inverted, only a load of one of the signals is put on the device outputs in the timing of each clock, and the load is constant. By obtaining an exclusive disjunction of the strobe signal and the video signal, a clock can be reproduced in an IC in a next stage.

A third embodiment of the present invention will next be described.

Figure 7:
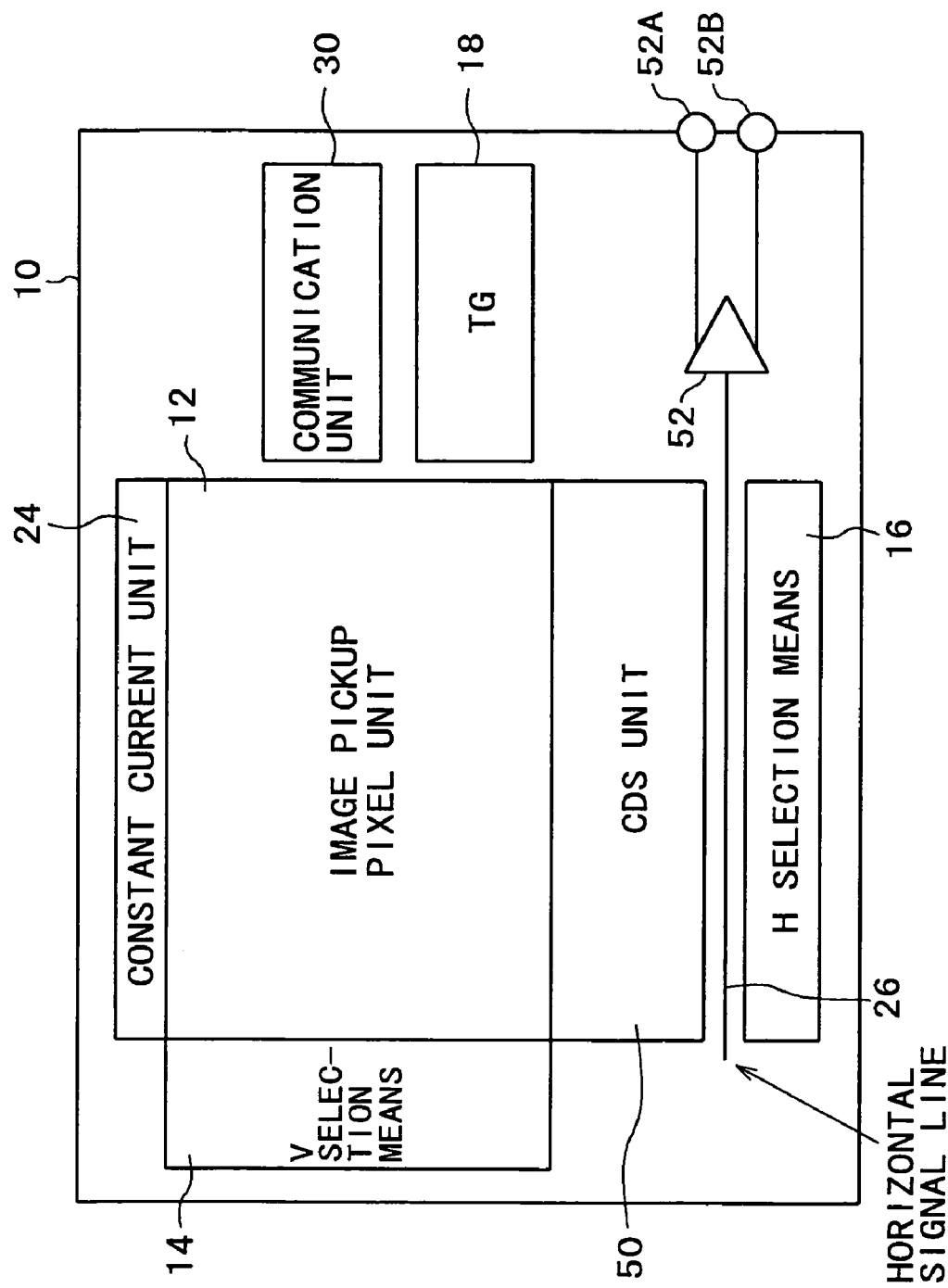
FIG. 7 is a plan view of an outline of a solid-state image pickup device according to a third embodiment of the present invention.

FIG. 7 is a plan view of an outline of a solid-state image pickup device according to a third embodiment of the present invention, showing main components necessary for a description of the solid-state image pickup device as a whole according to the third embodiment.

The solid-state image pickup device according to the third embodiment is formed by omitting the A/D unit 22 shown in FIG. 1, using a CDS unit 50 that omits a PGA unit in place of the CDS and PGA unit 20 shown in FIG. 1, and using an analog differential output amplifier 52 in place of the output buffer unit 28 shown in FIG. 1. The solid-state image pickup device according to the third embodiment thereby produces analog output.

Incidentally, the CDS unit 50 is the same as the CDS unit of the CDS and PGA unit 20. The other parts are the same as in the example shown in FIG. 1. Therefore, the other parts are identified by the same reference numerals as in FIG. 1, and their description will be omitted.

In such a configuration, the differential-output amplifier 52 outputs a signal from a horizontal bus line 26 (horizontal signal line) to the outside of the chip. At this time, the differential-output amplifier 52 outputs the signal in the form of differential signals of an analog video signal and an inverted analog video signal.

Figure 8:
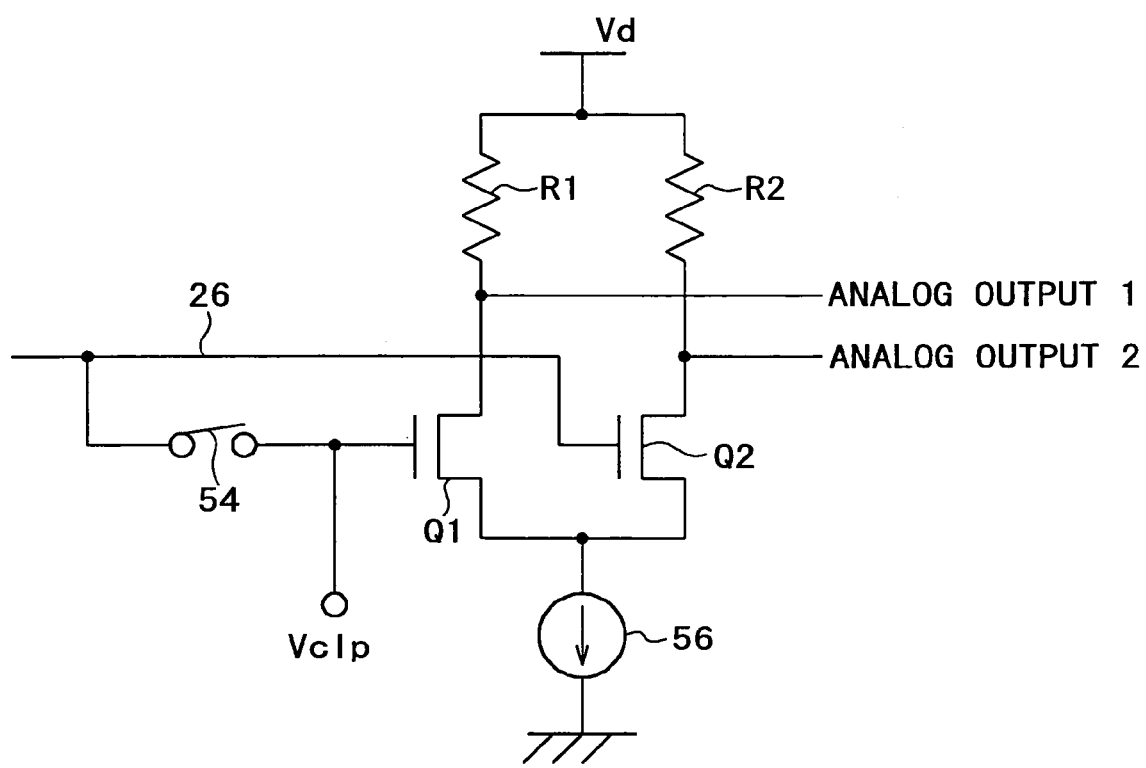
FIG. 8 is a circuit diagram showing an example of a configuration of a differential output amplifier provided in the solid-state image pickup device shown in FIG. 7.

FIG. 8 is a circuit diagram showing an example of a configuration of the differential-output amplifier 52.

As shown in FIG. 8, the differential-output amplifier 52 has a differential circuit with resistances R1 and R2 and MOS transistors Q1 and Q2 between a driving power supply Vd and a constant-current source 56. The analog video signal and the inverted analog video signal mentioned above are outputted as an analog output 1 and an analog output 2 from a node of the resistance R1 and the MOS transistor Q1 and a node of the resistance R2 and the MOS transistor Q2.

An input stage of the MOS transistors Q1 and Q2 is also of a differential type. The horizontal bus line 26 (horizontal signal line) is connected to a gate of one MOS transistor Q2, and a clamping voltage Vclp is applied to a gate of the other MOS transistor Q1.

A clamping switch 54 is inserted between the horizontal signal line 26 and the clamping voltage Vclp. The horizontal signal line 26 is reset to the clamping voltage Vclp via the clamping switch 54.

After the clamping switch 54 is opened, a signal from the CDS unit 50 is put on the horizontal bus line 26, and a difference between the signal and the clamping voltage Vclp is amplified and then outputted to the analog output 1 and the analog output 2.

Incidentally, depending on the load setting, a two-stage configuration in which a differential amplifier with a higher driving capability is disposed in a succeeding stage may be used, or a configuration in which output is produced through a voltage follower may be used.

Such analog output inherently requires one video output terminal and is, therefore, advantageous for miniaturization of the device.

In this example, two outputs are required, but do not present a great problem in miniaturization of the device. Further, when one of the two analog outputs is at a high potential, the other is at a low potential. Thus, for the same reason described in the example of FIG. 3, currents flowing through wirings to an IC in a next stage are in directions opposite to each other, and thereby undesired radiation is reduced. Further, less susceptibility to noise superimposed on paths to the IC in the next stage is obtained.

It is thereby possible to alleviate a problem associated with high-speed clock output, a problem associated with a long distance to the IC in the next stage, or a problem of the presence of an adjacent apparatus susceptible to radiation.

It is to be noted that while the example shown in FIG. 7 is also a CMOS-type image sensor as an example of a configuration of a solid-state image pickup device, the present invention is not limited to the above-described configuration and is similarly applicable to CCD-type solid-state image pickup devices and solid-state image pickup devices in general that output analog video signals.

As described above, a solid-state image pickup device according to the present invention outputs a video signal and an inverted video signal of the video signal from an output buffer unit. Therefore, by using a differential circuit in an input stage of a circuit in a next stage, it is possible to realize a configuration that enables even signals blunted to some degree to be detected reliably, and thereby to realize super-high speed video signals.

Further, an output method of a solid-state image pickup device according to the present invention outputs a video signal and an inverted video signal of the video signal from an output buffer unit. Therefore, by using a differential circuit in an input stage of a circuit in a next stage, it is possible to realize a configuration that enables even signals blunted to some degree to be detected reliably, and thereby to realize super-high speed of video signals.

In the foregoing first embodiment, in particular, a differential amplifier is used in the input stage of the IC in the next stage, and it is able to recognize even signals having blunter waveforms. This enables an increase in speed of the system, an addition of capacitance to signal paths, or a reduction in size of the output buffer unit of the solid-state image pickup device. When the output signals are changed, the charging and discharging currents of the paths flow in the directions of the arrows shown in FIG. 4, for example. However, the output and the inverted output flow in opposite directions. Therefore, when the paths are disposed adjacent to each other, undesired radiations can be reduced by canceling each other.

Further, in addition to the effects of the first embodiment, the foregoing second embodiment makes it possible to reduce the number of output terminals. The reduction in the number of output terminals, therefore, makes it possible to miniaturize the solid-state image pickup device and a camera using the solid-state image pickup device. Further, since the second embodiment has two signal output terminals including an inverted signal output terminal, it is easy to control a phase difference between output signals to within an allowable range, and it is thus easier to increase clock speed.

Further, the foregoing third embodiment has the effect of alleviating the problem of undesired radiation and obtaining less susceptibility to noise superimposed on paths to an IC in a next stage.

What is claimed is:

1. A solid-state image pickup device comprising:
    an image pickup pixel unit including a plurality of pixels;
    a signal processing unit for subjecting a pixel signal outputted from the plurality of pixels to predetermined signal processing;
    an output buffer unit for outputting the pixel signal processed by said signal processing unit, wherein said output buffer unit outputs said pixel signal and an inverted pixel signal obtained by inverting said pixel signal; and
    an analog/digital conversion unit for converting the pixel signal into a digital signal in a stage preceding said output buffer unit, wherein said pixel signal and said inverted pixel signal outputted from said output buffer unit are digital signals,
    wherein all bit data of said pixel signal is outputted by time division from one output terminal of said output buffer unit, and all bit data of said inverted pixel signal is outputted by time division from one inverted output terminal of said output buffer unit, and
    wherein said pixel signal and inverted pixel signal outputs of said output buffer unit are configured for connection to a next stage that is separate from the image pickup device.

2. The solid-state image pickup device of claim 1, wherein said pixel signal and inverted pixel signal outputs of said output buffer unit are configured to accommodate a cancellation of an undesired radiation from the paths of the pixel signal and the inverted pixel signal between the image pickup device and the next stage.

3. The solid-state image pickup device of claim 1, wherein said image pickup device resides in a first chip and the next stage resides in a second chip.

4. A solid-state image pickup device comprising:
    an image pickup pixel unit including a plurality of pixels;
    a signal processing unit for subjecting a pixel signal outputted from the plurality of pixels to predetermined signal processing;
    an output buffer unit for outputting the pixel signal processed by said signal processing unit, wherein said output buffer unit outputs said pixel signal and an inverted pixel signal obtained by inverting said pixel signal;
    an analog/digital conversion unit for converting the pixel signal into a digital signal in a stage preceding said output buffer unit, wherein said pixel signal and said inverted pixel signal outputted from said output buffer unit are digital signals, wherein all bit data of said pixel signal is outputted by time division from one output terminal of said output buffer unit, and all bit data of said inverted pixel signal is outputted by time division from one inverted output terminal of said output buffer unit; and
    strobe signal generating means for generating a strobe signal that allows a clock to be reproduced by obtaining an exclusive disjunction of the strobe signal and an output of said pixel signal or an output of said inverted pixel signal, and outputting the strobe signal.

5. A solid-state image pickup device as claimed in claim 4, wherein said strobe signal generating means outputs said strobe signal from an other terminal than the output terminal of said pixel signal and the output terminal of said inverted pixel signal.

6. A solid-state image pickup device as claimed in claim 4, wherein said strobe signal and an inverted strobe signal obtained by inverting said strobe signal are generated, and said strobe signal and said inverted strobe signal are outputted from output terminals independent of each other.

7. An output method of a solid-state image pickup device, wherein said solid-state image pickup device includes an image pickup pixel unit including a plurality of pixels, a signal processing unit for subjecting a pixel signal outputted from the plurality of pixels to predetermined signal processing, and an output buffer unit for outputting the pixel signal processed by said signal processing unit, said output method comprising;

outputting from said output buffer unit said pixel signal and an inverted pixel signal obtained by inverting said pixel signal, wherein said pixel signal and said inverted pixel signal are digital signals, wherein all bit data of said pixel signal is outputted by time division from one output terminal of said output buffer unit, and all bit data of said inverted pixel signal is outputted by time division from one inverted output terminal of said output buffer unit, and wherein said pixel signal and inverted pixel signal outputs of said output buffer unit are configured for connection to a next stage that is separate from the image pickup device.

8. The output method of claim 7, wherein said pixel signal and inverted pixel signal outputs of said output buffer unit are configured to accommodate a cancellation of an undesired radiation from the paths of the pixel signal and the inverted pixel signal between the image pickup device and the next stage.

9. The output method of claim 7, wherein said image pickup device resides in a first chip and the next stage resides in a second chip.

10. An output method of a solid-state image pickup device, wherein said solid-state image pickup device includes an image pickup pixel unit including a plurality of pixels, a signal processing unit for subjecting a pixel signal outputted from the plurality of pixels to predetermined signal processing, and an output buffer unit for outputting the pixel signal processed by said signal processing unit, said output method comprising:

outputting from said output buffer unit said pixel signal and an inverted pixel signal obtained by inverting said pixel signal, wherein said pixel signal and said inverted pixel signal are digital signals, wherein all bit data of said pixel signal is outputted by time division from one output terminal of said output buffer unit, and all bit data of said inverted pixel signal is outputted by time division from one inverted output terminal of said output buffer unit; and generating a strobe signal that allows a clock to be reproduced by obtaining an exclusive disjunction of the strobe signal and data of said pixel signal or said inverted pixel signal, and outputting the strobe signal.

11. An output method of a solid-state image pickup device as claimed in claim 10, wherein said strobe signal is outputted from an other terminal than the output terminal of said pixel signal and the output terminal of said inverted pixel signal.

12. An output method of a solid-state image pickup device as claimed in claim 10, wherein said strobe signal and an inverted strobe signal obtained by inverting said strobe signal are generated, and said strobe signal and said inverted strobe signal are outputted from output terminals independent of each other.

13. A system including a solid-state image pickup device, said system comprising;

an image pickup pixel unit including a plurality of pixels;

a signal processing unit for subjecting a pixel signal outputted from the plurality of pixels to predetermined signal processing;

an output buffer unit for outputting the pixel signal processed by said signal processing unit; and a signal processing circuit formed on a substrate separate from said solid-state image pickup device, for receiving the signal from said output buffer unit;

wherein said output buffer unit outputs said pixel signal and an inverted pixel signal obtained by inverting said pixel signal via a first terminal and a second terminal, respectively; and wiring for connecting said signal processing circuit to said first terminal and wiring for connecting said signal processing circuit to said second terminal are disposed adjacent to each other, wherein said wirings are respectively configured to accommodate a cancellation of undesired radiation from the paths of the pixel signal and the inverted pixel signal between the image pickup device and the signal processing circuit.

14. A system including a solid-state image pickup device as claimed in claim 13, wherein each of the pixels of said image pickup pixel unit includes:

a photoelectric converting device;

transfer means for transferring a signal charge converted and stored by said photoelectric converting device to a floating diffusion part;

reset means for resetting potential of said floating diffusion part; and amplifying means for outputting an output signal corresponding to the potential of said floating diffusion part.

* * * * *

UNITED STATES PATENT AND TRADEMARK OFFICE
CERTIFICATE OF CORRECTION

PATENT NO. : 7,339,151 B2  Page 1 of 1
APPLICATION NO. : 11/600846
DATED : March 4, 2008
INVENTOR(S) : Keiji Mabuchi It is certified that error appears in the above-identified patent and that said Letters Patent is hereby corrected as shown below:

Front Page:
Item (30) should read:
-- Feb. 12, 2002     (JP) ....................................................P2002-033883 --.

Signed and Sealed this

First Day of July, 2008

JON W. DUDAS
*Director of the United States Patent and Trademark Office*